United States Patent [19]

Krambeck

[11] 3,967,136
[45] June 29, 1976

[54] INPUT CIRCUIT FOR SEMICONDUCTOR CHARGE TRANSFER DEVICE CIRCULATING MEMORY APPARATUS

[75] Inventor: Robert Harold Krambeck, South Plainfield, N.J.

[73] Assignee: Bell Telephone Laboratories, Incorporated, Murray Hill, N.J.

[22] Filed: June 7, 1974

[21] Appl. No.: 477,193

[52] U.S. Cl. ............................ 307/221 D; 307/238; 307/304; 340/173 R; 340/173 RC; 357/24; 357/41
[51] Int. Cl.² .................. H01L 27/10; H01L 29/78; G11C 11/40
[58] Field of Search ............ 307/221 D, 208, 221 C, 307/304; 340/173 R, 173 RC, 173 CA; 357/24

[56] References Cited
UNITED STATES PATENTS

| | | |
|---|---|---|
| 3,638,039 | 1/1972 | Chen et al. .......................... 307/304 |
| 3,760,202 | 9/1973 | Kosonocky .......................... 357/24 |
| 3,801,826 | 4/1974 | Gorski .............................. 307/304 |
| 3,889,245 | 6/1975 | Gosney, Jr. ........................ 357/24 |

*Primary Examiner*—William D. Larkins
*Attorney, Agent, or Firm*—D. I. Caplan

[57] ABSTRACT

In a semiconductor charge transfer device circulating memory, the input control circuit to the device has the capability of either allowing the previous stream of charge packets either to continue circulating as the same information or of modifying the stream in accordance with a "write data" external signal, as each circulating bit passes from the output to the input charge storage site of the semiconductor charge transfer device. This invention involves the use of appropriately located integrated circuit transistor means for draining off excess electrical charges which have been found to accumulate at certain terminals in the input circuit, in order to suppress spurious error signals otherwise generated by these excess charges.

8 Claims, 2 Drawing Figures

INPUT CIRCUIT FOR SEMICONDUCTOR CHARGE TRANSFER DEVICE CIRCULATING MEMORY APPARATUS

FIELD OF THE INVENTION

This invention relates to semiconductor apparatus and, more specifically, to control circuitry for semiconductor charge transfer devices.

BACKGROUND OF THE INVENTION

A semiconductor charge transfer device (CTD) is a form of shift register or delay line device, in which an input data stream sequence of signal input charge packets is sequentially delayed and shifted through a succession of localized semiconductor charge transfer stages in a semiconductor medium. Each such transfer stage includes an integral number of charge storage sites to which a timed clock pulse sequence of voltage pulses is applied. There are as many storage sites per transfer stage as there are phases in the clock pulses. The desired sequential charge shift and storage operations through the CTD are obtained by means of a timed clock sequence of signal charge transfers from site to site, which results in response to the correspondingly timed clock sequence of voltages applied to the storage sites.

One particularly useful form of a semiconductor CTD is the "C4D", the Conductively Connected Charge Coupled Device, as described for example in an article by R. H. Krambeck (inventor herein) et al., entitled "Conductively Connected Charge-Coupled Device", published in *IEEE Transactions on Electron Devices*, Vol. ED-21, No. 1 (Jan. 1974), pp. 70–72; and in an article by C. N. Berglund et al., entitled "A Fundamental Comparison of Incomplete Charge Transfer in Charge Transfer Devices", published in *Bell System Technical Journal*, Vol. 52, No. 2 (Feb. 1973), pp. 147–182, at pp. 164–166. Briefly, such a device is driven by a two-phase clock pulse voltage source, and the device contains storage sites each of which has a p-n junction barrier located at the surface of the semiconductor underneath, and in registry with, the extremity of each driving electrode on the charge packet input side thereof. The two-phase clock voltage source contains two terminals, one for supplying clock voltage pulses during a sequence of time periods alternating with that of the other terminal.

One particular application of charge transfer devices is the design of such devices as circulating memories, in the form of a CTD in which a memory stream of data can circulate, in which the circulating stream of bits of data (information) can be modified ("updated") at will. Typically, this modification of the circulating sequence of bits of information is achieved by means of control circuitry located between an output and an input terminal of the circulating memory charge transfer device. This control circuitry typically contains at least one network ("write-enable") for enabling fresh data to be written into the circulating data as each datum reaches the control circuitry from an output terminal of the charge transfer device. In addition, the control circuitry also contains another input terminal to receive the desired sequence of new information to be written into the circulating memory during those periods of time in which the "write-enable" terminal(s) is activated by an external "write-enable" signal.

Control circuits for updating the information in a circulating semiconductor CTD memory suffer from the generation of spurious (error) signals which incorrectly rewrite data into the circulating memory. It has been thought that these error signals could be avoided by means of a single electrical charge drainoff means ("sink") connected to the output terminal of the charge transfer device. However, it has been found that even with the use of such charge drainoff means, the control circuitry nonetheless suffers from the production of spurious rewrite of data signals into the circulating memory.

SUMMARY OF THE INVENTION

In order to reduce the rate of error signals introduced by the control circuitry of a circulating semiconductor CTD, further charge sinks are supplied in the control circuitry, thereby affording the rewriting capability of fresh update information into the circulating memory stream of the device with reduced error rates. More specifically, additional charge sinks means are introduced in the write-enable network, as well as on the return line between the output and input terminals of the CTD on the far side of the CTD output terminal subsequent to that terminal in the return line at which the write-enable signal is introduced. These charge sinks means drain off spurious charges otherwise accumulating in the control circuitry.

In a specific embodiment of the invention, a charge transfer device of the C4D type is in a circulating memory configuration integrated on a single semiconductor chip with control circuitry for updating the information stream in the circulating memory. Charge sinks means are provided in the form of integrated circuit type of insulated gate field effect transistors (IGFET) whose source terminal is connected to an appropriate terminal of the control circuit and whose gate and drain terminals are both connected to a terminal of one of the clock voltage source terminals of the circulating semiconductor charge transfer device. These charge sink IGFETs can be integrated on the same semiconductor chip (wafer) as both the control circuitry and the CTD themselves, thereby providing a monolithic semiconductor memory device. One of these charge sink means is advantageously connected to a terminal of the write-enable network. Thereby, spurious charges which would otherwise accumulate at this write-enable network terminal are drained off from the write-enable network. Advantageously, this draining is accomplished only during a first predetermined sequence of first clock phase periods of the voltage source which shifts the information stream of the transfer device. More specifically, at this terminal of the write-enable network, the source terminal of an integrated circuit type of insulated gate field effect transistor is connected, the gate and drain terminals of this transistor being connected together to a first terminal of the voltage pulse source driving the charge transfer device (which supplies voltage pulses during the first clock phase periods).

In addition, a second charge sink means is provided in the control circuitry, for draining off spurious electrical charges in the return line from the output to the input terminal of the charge transfer device. More specifically, in the return line there is connected a transistor switching means both of whose high current carrying terminals are connected into the return line, while one of these high current carrying terminals is connected to the output terminal of the transfer device. This transistor switching means thereby serves the function of breaking the continuity on the return line from the output terminal to the input terminal of the transfer device in response to write-enabling signals supplied by the write-enable network. To the other high current carrying terminal of the switching means, on the opposite side of this transistor switching means from the terminal thereof connected to the output terminal of the transfer device, there is connected the second charge sink means for draining off spurious electrical charges which otherwise would accumulate in the return line at this terminal of the switching means (in common with a first terminal of the return line). This second means for draining off electrical charges is activated to drain off the spurious charges only during typically the same clock phase periods as the first means for draining off the electrical charges in the write-enable networks described above. The second means for draining off electrical charges in the return line typically takes the form of an insulated gate field effect transistor whose source terminal is connected to the above-mentioned first terminal of the return line and whose drain and gate terminals are connected to the same terminal of the voltage pulse source as the gate and drain terminals of the first means for draining off electrical charges.

The charge transfer device, together with its return line, its write-enable network, as well as its write-data network for feeding in fresh information for updating the information stream in the charge transfer device, can all be integrated in accordance with known monolithic integrated circuit techniques into the same semiconductor chip (wafer).

BRIEF DESCRIPTION OF THE DRAWING

This invention, together with its features, advantages and objects, can be better understood from a reading of the following detailed description, taken in conjunction with the drawings in which.

Figure 1:
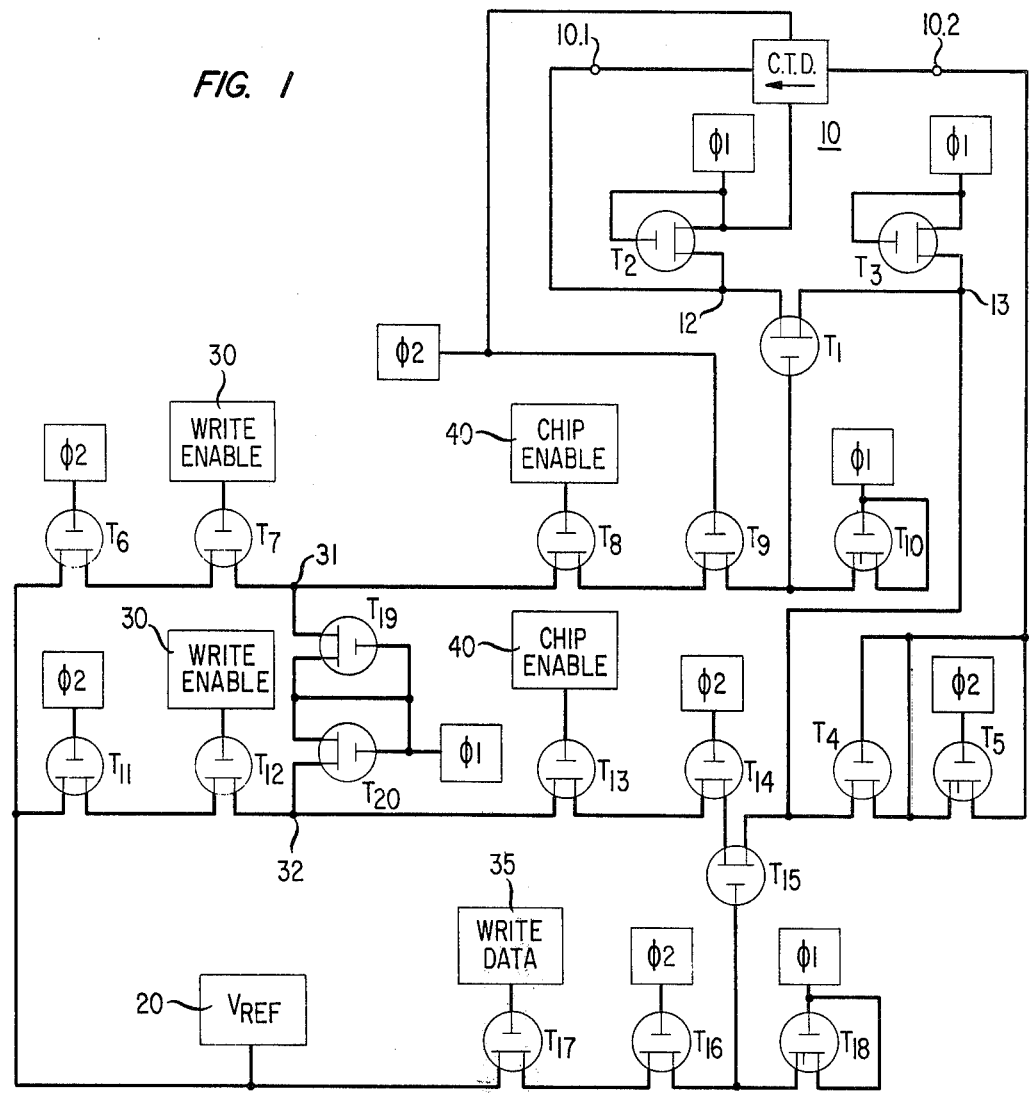
FIG. 1 is an electrical circuit diagram of a circulating semiconductor memory apparatus with means for draining off spurious electrical charges in its write-enable network and return line, in accordance with a specific embodiment of the invention.

For the sake of clarity only, none of the drawings is to scale.

DETAILED DESCRIPTION

In the drawing, it is to be understood that, although there are many box elements labeled $\phi_1$ and $\phi_2$ (only for the sake of clarity and ease of reading the drawing), all such box elements labeled $\phi_1$ indicate the same first clock voltage pulse source having but a single output terminal, and all elements labeled $\phi_2$ indicate the same second (but different from the first) clock voltage pulse source likewise having but a single but different output terminal. Similar considerations apply to the write-enable source 30 and the chip-enable source 40, there being only one of each such sources in actuality.

As shown in FIG. 1, a semiconductor charge transfer device (CTD) 10, typically a C4D as identified above, has an output terminal 10.1 and an input terminal 10.2 for the output and input, respectively, of information charge packets being shifted in the transfer device. Transistors labeled $T_1$ through $T_{20}$, together with their interconnections, form an input control circuit for the CTD 10. These transistors, together with the CTD, are advantageously in the form of a monolithic integrated circuit located on a top major surface of a silicon semiconductor chip. The output terminal 10.1 is connected to the source terminal of a transistor $T_1$, one of the high current carrying terminals of said transistor. This transistor $T_1$ furnishes switching means for interrupting the continuity in a "return line" formed by the electrical line running from the output terminal 10.1 through the transistor $T_1$, through another transistor $T_4$, and back to the input terminal 10.2 of the transfer device. A switching transistor $T_2$ has one of its high current carrying terminals (its source terminal) connected to this return line at terminal 12 (between the output terminal 10.1 and the source terminal of the transistor $T_1$). The other high current carrying terminal (drain) of the transistor $T_2$, as well as its low current carrying terminal (gate), are connected together to the output terminal of the clock phase voltage source $\phi_1$ which feeds voltage pulses to the charge transfer device 10 during a first set of ("active") clock phase periods, as known in the art. Another of the high current carrying terminals (drain) of switching transistor $T_1$ is connected both to a high current carrying terminal of a switching transistor $T_3$ and a switching transistor $T_4$. As in the case of the transistor $T_2$, just described, the gate and drain terminals of the transistor $T_3$ are connected together with the output terminal of the voltage pulse source $\phi_1$; whereas the source terminal of $T_3$ is connected to terminal 13 in the return line. The purpose of the transistors $T_2$ and $T_3$ in the return line is to drain off excess spurious charges which otherwise accumulate at the respective terminals 12 and 13 in the return line at which these transistors are connected. These charges now will pass through the transistors $T_2$ and $T_3$ into the voltage pulse source $\phi_1$ acting as a charge sink thereby. The return line is completed by the transistors $T_4$ and $T_5$. This latter transistor $T_5$ is an IGFET with an added barrier on one of its sides, similar in structure to an element (transfer site) in a C4D shift register device. Transistors $T_5$ (as well as $T_{18}$ and $T_{10}$) are each indicated as an IGFET with an extra line segment in close proximity to the source terminals of these transistors, thereby indicating a p-n junction barrier in these transistors as known in C4D elements. The function of $T_4$ in the return line is to add a compensatory voltage drop in the return line, in order to compensate for the threshold voltage variation of IGFETs integrated in the top surface of semiconductor material. Thus, the input side of the charge transfer device 10 is advantageously integrated mutually in close proximity with the transistors $T_4$ and $T_5$, in order that $T_4$ may suitably compensate for the same threshold voltage.

It is to be noted that both high current carrying terminals of $T_5$ are connected together. The function of $T_5$ is for metering (measuring) out an appropriate amount of charge as a packet suitable for feeding into the input terminal 10.2 of the charge transfer device 10 in response to a signal from $T_4$. It should be understood that the first transfer element of the CTD 10 is controlled by the first clock phase voltage source $\phi_1$, whereas $T_5$ is controlled by the second clock phase voltage source $\phi_2$.

As understood in the art, $\phi_2$ provides clock voltage pulses to the charge transfer device 10 during a second sequence or set of time periods complementary to those of the first set of time periods associated with the clock voltage pulse source $\phi_1$. Thus, when the transistor $T_1$ is in its ON state, any information by way of a surge of voltage at the terminal 10.1 is communicated through the transistor $T_1$ into the threshold compensating transistor $T_4$, and thence into the input terminal 10.2 of the charge transfer device 10. The threshold compensating transistor $T_4$ is ON whenever the drain of $T_4$ is more negative than its source by one threshold voltage, and then $T_4$ is capable of transmitting charges from its source to its drain terminal.

As further shown in FIG. 1, means are provided for turning the transistor $T_1$ OFF and thereby suppressing the flow of information which would otherwise circulate in the return line from the output terminal 10.1 of the transfer device 10 to its input terminal 10.2. In a circulating memory, of course, such means are desirable in order to afford the possibility of feeding in new information to update the old information previously circulating in the charge transfer device 10 as each bit of such information reaches the terminal 10.1. Such updating occurs in response to a write-enabling signal from a write-enable voltage source 30 only when a chip-enabling signal is being supplied by a chip-enable voltage source 40. In this way, only that CTD 10 in the particular chip of semiconductor in which it is integrated (i.e., that chip which is being fed the chip-enabled signal) will have its information modified by the write-enabling signal. Transistors $T_6$ through $T_{18}$, together with their control voltage sources, form a write-enable network for this purpose of updating information.

In the write-enable network, the voltage reference source 20 supplies a suitable voltage to the source terminal of a switching transistor $T_6$ whose gate terminal is controlled by the clock voltage pulse source $\phi_2$, such that $T_6$ is in its ON state during the second set of clock phase periods. The gate terminals of transistors $T_7$ and $T_8$ are connected respectively to the write-enable voltage source 30 and the chip-enable voltage source 40. The high current carrying terminals of $T_7$ and $T_8$ are connected in series with the drain terminal of the transistor $T_6$. In addition, a switching transistor $T_9$, whose low current carrying (gate) terminal is controlled by $\phi_2$, is placed in series with $T_8$. Thus, $\phi_2$ supplies a voltage pulse to turn the transistors $T_6$ and $T_9$ into their ON states during the second set of "active" clock pulse periods. If, and only if, both the chip-enable source 40 and the write-enable source 30 simultaneously are maintaining respectively $T_8$ and $T_7$ in their ON states during an "active" phase of $\phi_2$, then there will be a voltage supplied to the gate of the switching transistor $T_1$ sufficient to turn $T_1$ into its OFF state and thereby break the continuity in the return line from the output terminal 10.1 to the input terminal 10.2 of the CTD 10. In this way, the return line at this moment is in condition to receive fresh data for updating the CTD. Finally, $T_{10}$, an element which is similar in structure to an element (transfer site) of a C4D device and which is controlled by the clock phase pulse source $\phi_1$, terminates the sequence of transistors $T_6$, $T_7$, $T_8$ and $T_9$ in order to drain off charges that would otherwise accumulate on the gate of the switching transistor $T_1$ during the first set of time periods associated with $\phi_1$.

When the transistor $T_1$ of the return line is in its OFF state, thereby suppressing the return of the previously stored bit of information then circulating in the charge transfer device 10 (and which would otherwise be passed immediately through the return line from the output terminal 10.1 back into the input terminal 10.2), only then is it possible to feed in fresh information from the write-data source 35. In order to have a means for introducing the fresh information into the CTD via the return line, the write-enable source 30 controls a switching transistor $T_{12}$ whose high current carrying terminals are in series with those of another switching transistor $T_{11}$. In turn, the gate of $T_{11}$ is controlled by the clock pulse voltage source $\phi_2$. Further, transistors $T_{13}$ and $T_{14}$ are connected with their high current carrying terminals in series with those of transistor $T_{12}$. The gate of $T_{13}$ is controlled by the chip-enable source 40, and the gate of $T_{14}$ is controlled by the clock pulse voltage source $\phi_2$. Moreover, the drain terminal of transistor $T_{14}$ is connected to the source terminal of a switching transistor $T_{15}$. The gate of $T_{15}$ is controlled by the drain terminal of transistor $T_{16}$ which is controlled in turn by the clock pulse voltage source $\phi_2$. Another switching transistor $T_{17}$, whose gate terminal is controlled by the write-data source 35 and whose source is supplied with reference voltage from the source 20, is connected as shown in the FIG. 1. The write-data source 35 provides the new digital data to be supplied to the CTD 10 for updating the circulating information therein.

When simultaneously a voltage pulse from $\phi_2$ and from the write-enable source 30 and the chip-enable source 40 furnish voltage pulses to enable current to flow from the reference source 20 through transistors $T_{11}$, $T_{12}$, $T_{13}$ and $T_{14}$; and when simultaneously the write-data source 35 and the clock phase $\phi_2$ likewise turn the transistors $T_{17}$ and $T_{16}$, respectively, into their ON states, then the reference voltage 20 is supplied directly to the gate of transistor $T_{15}$ to turn it ON, so that at the same time current can flow from the reference source 20 through $T_{11}$, $T_{12}$, $T_{13}$, $T_{14}$, and thence through $T_{15}$. In such a case, during the clock phase $\phi_2$, charge will flow through transistor $T_{15}$ and through transistor $T_4$ into transistor $T_5$, which measures (meters) out an appropriate standard amount of charge for the input charge packet to the CTD 10 at its input terminal 10.2.

During the active phase of clock voltage source $\phi_2$, charge can flow (if any is being supplied by the return line through $T_4$) into the transistor $T_5$ by reason of the capacitance between its gate electrode and the surface of the semiconductor body at the location of this transistor. Thus, when the active phase of $\phi_2$ terminates and the active phase of $\phi_1$ commences, the stored charge in $T_5$ flows from this transistor through the input terminal 10.2 into the first element on the input side of the CTD 10 adjacent to this terminal 10.2.

As further indicated in FIG. 1, advantageously a transistor $T_{18}$ of the same structure as a C4D element (similar to the transistor $T_5$) serves as a preset voltage source for the gate of $T_{15}$, that is, to set the voltage of the gate of $T_{15}$ at a value equal to the voltage pulse height of the active phase of the source $\phi_1$ less the sum of the threshold voltage of the semiconductor material in the neighborhood of $T_{15}$ and the barrier height of the p-n junction within the transistor $T_{18}$.

As further indicated in FIG. 1, the source terminal of an IGFET transistor $T_{19}$ is connected to terminal 31 (in common with the mutually connected pair of high current carrying terminals of transistors $T_7$ and $T_8$). Likewise, the source terminal of an IGFET transistor $T_{20}$ is connected to terminal 32 (in common with the mutually connected pair of high current carrying terminals of transistors $T_{12}$ and $T_{13}$). The drain and gate terminals of each of the transistors $T_{19}$ and $T_{20}$ are connected to the output terminal of the clock voltage pulse source $\phi_1$. Thereby, spurious charges which would otherwise accumulate at terminals 31 and 32 are drained off during the active phases associated with the voltage source $\phi_1$ (acting as a charge sink). In this way spurious error signals which otherwise would be introduced into the information stream of the CTD 10 are suppressed.

The purpose of the network formed by transistors $T_{17}$, $T_{16}$ and $T_{18}$ (controlling $T_{15}$), in addition to the network formed by transistors $T_{11}$, $T_{12}$, $T_{13}$ and $T_{14}$, is to invert the data before introduction into the CTD, as required when there is an odd number of inversions in the CTD 10. When there is an even number of inversions in the CTD 10, then the write-data source 35 can be connected directly to the gate terminal of $T_{15}$ while $T_{17}$, $T_{16}$ and $T_{18}$ can then be omitted.

Figure 2:
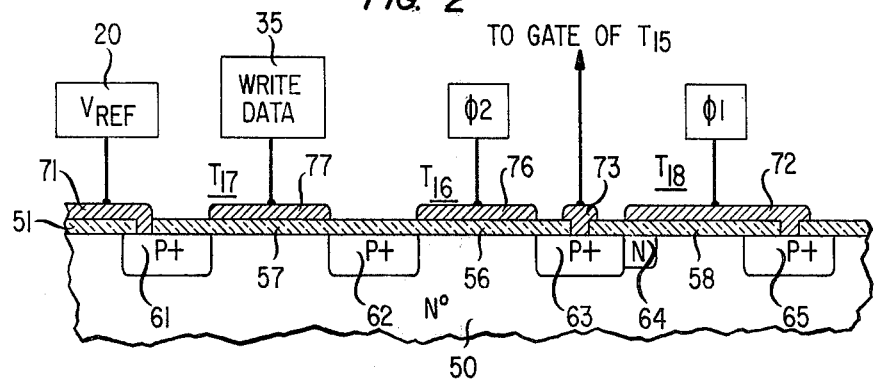
FIG. 2 is a cross-section diagram of an integrated circuit realization of a portion of the circuit shown in FIG. 1.

FIG. 2 shows the portion of FIG. 1, including the transistors $T_{16}$, $T_{17}$ and $T_{18}$, of circuitry integrated together on the top surface of a semiconductor chip 50. The semiconductor chip 50 is typically of relatively low N-type semiconductor electrical conductivity, and is therefore denoted by the symbol N°. The reference voltage source 20 supplies voltage to the source region 61 of the transistor $T_{17}$ through an electrode contact 71. Typically, the electrode contact is insulated from the substrate of the chip 50 by an electrically insulating oxide layer 51. The source region 61 is of strongly P-type semiconductor electrical conductivity, denoted by P+, as known in the art. The write-data source 35 is connected to the gate electrode 77 of the transistor $T_{17}$. This electrode 77 is insulated from the top surface of the chip 50 by an insulating layer portion 57, typically of silicon dioxide.

The drain region of the transistor $T_{17}$ (FIG. 2) is provided by another P+ type conductivity region 62, which serves also as the source region for the transistor $T_{16}$. An electrode layer 76 serves as the gate electrode for the transistor $T_{16}$. This electrode 76 is separated from the surface of the chip 50 by an insulating layer portion 56, typically also of silicon dioxide as known in the art. A P+ type conductivity region 63 serves as the drain region for the transistor $T_{16}$ as well as a source region for the transistor $T_{18}$. An electrode layer 73, in direct contact with the P+ region 63, is connected to the gate of $T_{15}$ (which is not shown in FIG. 2). In addition, an N-type conductivity region 64 forms a p-n junction with the P+ type region 63, as known in the C4D structure. It is to be undersooood that advantageously the electrical conductivity of the N-type region 64 is higher than that of the substrate 50, but is of a lower value than (and of opposite type from) that of the P+ type region 63. An electrode layer 72, connected to the source $\phi_1$ as well as to another P+ type conductivity (drain) region 65, serves to connect the gate electrode (formed by that portion of the electrode layer 72 lying over the chip 50 between the nearest extremities of P+ regions 63 and 65) to the drain region 65 itself. An insulating layer 58 separates the electrode 72 at an appropriate distance from the surface of the chip 50 in the gate region of $T_{18}$, similarly as the insulating layers 56 and 57.

Thus, all of the transistor elements shown in FIG. 1 can easily be integrated into the same semiconductor chip 50 whose top surface furnishes locations for the inversion layer gate channels for these transistors as well as for the source and drain regions of these transistors.

In the present state of the art, of course, the preferred semiconductor material for the chip 50 is silicon. However, other semiconductors may be used.

While this invention has been described in terms of specific embodiment, various modifications can be made by a skilled worker without departing from the spirit and scope of the invention. For example, the operation of $T_{15}$, with respect to its being ON and OFF, is described above in a case in which there are an odd number of charge regenerators in the CTD 10. These regenerators are supplied in the CTD for the purpose of restoring the shifting charge packets to their binary condition at the input terminal. Such regenerators are usually put into the CTD every fifty or so transfer stages.

What is claimed is:
1. A circulating memory semiconductor apparatus which comprises:
   a. a semiconductor charge transfer device having an input terminal and an output terminal, said charge transfer device for shifting charges representing information in response to at least first and second clock pulse voltages of different relative phases;
   b. a write-enable network for modifying information circulating in said charge transfer device, said write-enable network including a plurality of transistor switching means, each said transistor switching means having first and second high current carrying terminals and a control terminal, current flow between said first and second high current carrying terminals being controlled by signals applied to the respective control terminals, said plurality of transistor switching means including
   a first transistor switching means having its first and second high current carrying terminals connected in series between the input terminal and the output terminal of said charge transfer device, such that during operation information signals from said output terminal are decoupled from said input terminal upon application of a suitable first control signal applied to the control terminal of said first transistor switching means and that said information signals from said output terminal are coupled to said input terminal only upon absence of said first control signal to the control terminal of said first transistor switching means, said write-enable network further including second and third transistor switching means for supplying said first control signal to the control terminal of said first transistor switching means only during application of said second clock pulse voltage, the first and second high current carrying terminals of said second and third transistor switching means being connected in series between said control terminal of said first transistor switching means and a reference terminal for connection to a voltage source, such that said second and third transistor switching means supply said first signal to the control terminal of said first transistor switching means only upon simultaneous application of suitable second and third control signals to the control terminals respectively of said second and third transistor switching means; and
   c. fourth transistor switching means, having first and second high current carrying terminals and a con- trol terminal, for preventing application of said first control signal to the control terminal of said first transistor switching means upon sequential, rather than simultaneous, application of said second and third signals to the control terminals of said second and third transistor switching means, the first and second high current carrying terminals of said fourth transistor switching means being coupled in series between a first clock pulse voltage terminal connected to a source of said first clock pulse voltage and a first node along the series path between said reference terminal and said control terminal of said first transistor switching means, said first node being located between said second and third transistor switching means, the control terminal of said fourth transistor switching means being connected to said first clock pulse voltage terminal in order that during operation said fourth transistor switching means couple said first node to said first clock pulse voltage terminal only during application of said first clock pulse voltage.

2. Apparatus according to claim 1 which further includes said voltage source connected to said reference terminal, said voltage source being a reference voltage source.

3. Apparatus according to claim 2 which further includes a fifth transistor switching means having first and second high current carrying terminals and a control terminal and having its first and second high current carrying terminals connected in parallel with respect to the first transistor switching means relative to the input and output terminals of the said transfer device, such that during operation when said information signals from said output terminal of the transfer device are decoupled from said input terminal by virtue of the application of said first control signal during said first clock pulse voltage then said fifth transistor switching means enables the flow of fresh information to said input terminal of the transfer device in accordance with fresh information signals supplied by a fresh information source which controls the control terminal of said fifth transistor switching means.

4. Apparatus according to claim 3 which further includes sixth and seventh transistor switching means controlled respectively by said second and third control signals, said sixth and seventh transistor means each having first and second high current carrying terminals and a control terminal the first and second high current carrying terminals of said sixth and seventh transistor switching means being coupled in series between said reference terminal and the first high current carrying terminal of the fifth transistor switching means in order to enable the said flow of fresh information to the input terminal of the transfer device upon simultaneous application of said second and third control signals respectively to said sixth and seventh transistor switching means.

5. Apparatus according to claim 4 which further includes eighth transistor switching means, having first and second high current carrying terminals and a control terminal, for preventing said flow of fresh information to the input terminal of the transfer device, the first and second high current carrying terminals of said eighth transistor switching means being coupled in series between said first clock pulse voltage terminal and second node along the series path between said reference terminal and said first terminal of the fifth transistor switching means, said second node being located between said sixth and seventh transistor switching means, the control terminal of said eighth transistor switching means being connected to said first clock pulse voltage terminal in order that during operation said eighth transistor switching means couple said second node to said first clock pulse voltage terminal only during application of said first clock pulse voltage.

6. Apparatus according to claim 1 which further includes a fifth transistor switching means, having first and second high current carrying terminals and a control terminal, having its first and second high current carrying terminals connected in parallel with respect to the first transistor switching means relative to the input and output terminals of the said transfer device, such that during operation when said information signals from said output terminal of the transfer device are decoupled from said input terminal by virtue of the application of said first control signal during said first clock pulse voltage then said fifth transistor switching means enables the flow of fresh information to said input terminal of the transfer device in accordance with fresh information signals supplied to the control terminal of said fifth transistor switching means.

7. Apparatus according to claim 6 which further includes sixth and seventh transistor switching means said sixth and seventh transistor means each having first and second high current carrying terminals and a control terminal controlled respectively by said second and third control signals, the first and second high current carrying terminals of said sixth and seventh transistor switching means being coupled in series between said reference terminal and the first high current carrying terminal of the fifth transistor switching means in order to enable the said flow of fresh information to the input terminal of the transfer device upon simultaneous application of said second and third control signals respectively to said sixth and seventh transistor switching means.

8. Apparatus according to claim 7 which further includes eight transistor switching means, having first and second high current carrying terminals and a control terminal, for preventing said flow of fresh information to the input terminal of the transfer device, the first and second high current carrying terminals of said eighth transistor switching means being coupled in series between said first clock pulse voltage terminal and a second node along the series path between said reference terminal and said first terminal of the fifth transistor switching means, said second node being located between said sixth and seventh transistor switching means, the control terminal of said eighth transistor switching means being connected to said first clock pulse voltage terminal in order that during operation said eighth transistor switching means couple said second node to said first clock pulse voltage terminal only during application of said first clock pulse voltage.

* * * * *